(12) United States Patent
Shin

(10) Patent No.: US 8,535,964 B2
(45) Date of Patent: Sep. 17, 2013

(54) FRAME ASSEMBLY EXTENDING DONOR FILM, METHOD OF MANUFACTURING DONOR FILM USED IN LASER INDUCED THERMAL IMAGING(LITI), AND METHOD OF MANUFACTURING ORGANIC LIGHT EMITTING DEVICE

(75) Inventor: Min-Soo Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 516 days.

(21) Appl. No.: 12/789,867

(22) Filed: May 28, 2010

(65) Prior Publication Data

US 2010/0311198 A1 Dec. 9, 2010

(30) Foreign Application Priority Data

Jun. 4, 2009 (KR) .................. 10-2009-0049480

(51) Int. Cl.
*H01L 21/00* (2006.01)

(52) U.S. Cl.
USPC .......................................... 438/34; 438/455

(58) Field of Classification Search
USPC .................... 438/34, 455; 430/200
See application file for complete search history.

(56) References Cited

U.S. PATENT DOCUMENTS 6,226,020 B1    5/2001  Schuster et al.
6,485,884 B2 *  11/2002 Wolk et al. .................. 430/200
7,387,864 B2 *  6/2008  Felder et al. .................. 430/200
2006/0081975 A1 4/2006  Kang
2007/0049033 A1 3/2007  Lee et al.

FOREIGN PATENT DOCUMENTS

KR      10-2006-0034586       4/2006
KR      10-2006-0042773 A     5/2006
KR         10-0658267        12/2006

OTHER PUBLICATIONS

KIPO Registration Determination Certificate dated Aug. 31, 2011, for application 10-2009-0049480, 5 pages.

* cited by examiner

*Primary Examiner* — Zandra Smith
*Assistant Examiner* — Toniae Thomas
(74) *Attorney, Agent, or Firm* — Christie, Parker & Hale, LLP

(57) ABSTRACT

A frame assembly to stretch a donor film used in laser induced thermal imaging (LITI), a method of manufacturing the donor film, and a method of manufacturing an organic light emitting device. The frame assembly to stretch a donor film includes: a main body including a center opening; a first support portion including a film mounting guide portion on which the donor film is mounted; a second support portion that including a film pressing portion that presses a donor film in a direction perpendicular to a coupling direction of the frame main body and the first support portion; and an elastic member disposed between the first support portion and the main body, wherein the first support portion is coupled to an inner portion of the main body by a first coupling member, and wherein the second support portion is coupled to an inner portion of the first support portion in a direction perpendicular to the coupling direction of the main body and the first support portion by a second coupling member.

30 Claims, 11 Drawing Sheets

FRAME ASSEMBLY EXTENDING DONOR FILM, METHOD OF MANUFACTURING DONOR FILM USED IN LASER INDUCED THERMAL IMAGING(LITI), AND METHOD OF MANUFACTURING ORGANIC LIGHT EMITTING DEVICE

CROSS-REFERENCE TO RELATED APPLICATION

This application claims the benefit of Korean Patent Application No. 10-2009-0049480, filed Jun. 4, 2009 in the Korean Intellectual Property Office, the disclosure of which is incorporated herein by reference.

BACKGROUND

1. Field

Aspects of the present invention relate to a frame assembly extending a donor film, a method of manufacturing a donor film used in laser induced thermal imaging (LITI), and a method of manufacturing an organic light emitting device using the frame assembly, and more particularly, to a frame assembly capable of tightly extending the donor film, a method of manufacturing the donor film used in LITI by using the frame assembly, and a method of manufacturing an organic light emitting device.

2. Description of the Related Art

An organic light emitting device is a flat panel display device that includes an anode electrode, a cathode electrode, and an intermediate layer. The intermediate layer is interposed between the anode electrode and the cathode electrode and includes at least one organic light emitting layer. The organic light emitting device has a wide viewing angle, excellent contrast ratio, and high response speed. Thus, the organic light emitting device is regarded as a next generation display device.

According to whether a light emitting layer is formed of a polymer organic material or a low-molecular organic material, the organic light emitting device may further include one or more organic layers, other than the organic light emitting layer, selected from the group consisting of a hole injection layer, a hole transport layer, an electron transport layer, and an electron injection layer.

In order for the organic light emitting device to achieve full color representation, the organic layer of the organic light emitting device must be patterned. Patterning may be performed using a shadow mask method in the case of a low-molecular organic light emitting device, and an inkjet printing method or laser induced thermal imaging (LITI) is used in the case of a polymer organic light emitting device. When LITI is used, the organic layer can be minutely patterned and be applied to a large surface, which is advantageous for achieving high image resolution.

When an organic layer is manufactured using LITI, at least a light source, an organic light emitting device substrate (acceptor substrate), and a donor film are needed. The donor film has a base film, a light to heat conversion (LTHC) layer, and a transfer layer. Light emitted from the light source is absorbed into the LTHC layer of the donor film and is converted to heat energy. The converted heat energy causes a change in the adhesion force between the LTHC layer, the transfer layer, and the acceptor substrate. Thus, materials of the transfer layer of the donor film are transferred onto the acceptor substrate, thereby patterning an organic light emitting layer on the acceptor substrate.

Conventionally, a base film including the LTHC layer is manually cut to a predetermined size by using a device, such as a straw cutter. The cut base film is fixed to a frame using a tape or an adhesive, and then a transfer layer is formed on the base film fixed on the frame to become the donor film. Next, the donor film including the transfer layer is detached from the frame and put on a vacuum chuck having a vacuum hole. The donor film is aligned on the acceptor substrate while applying a vacuum force thereto, thereby transferring the transfer layer from the donor film onto the acceptor substrate by LITI transfer.

However, during the above conventional LITI transfer method, although the donor film put on the vacuum chuck is fixed to the vacuum chuck by applying a vacuum force thereto, it is not possible to tightly extend or stretch the flexible donor film. Accordingly, minute air gaps are formed between the donor film and the acceptor substrate. Due to these air gaps, it is not possible to exactly transfer the transfer layer from the donor film onto the acceptor substrate, thereby causing defects in the organic light emitting device. To address this problem, the donor film may be laminated on the acceptor substrate by using a roller, but minute air gaps are still formed between the donor film and the acceptor substrate because it is not possible to extend or stretch the donor film as tightly as necessary.

SUMMARY

Aspects of the present invention provide a frame assembly tightly extending or stretching a donor film, a method of manufacturing a donor film used in laser induced thermal imaging (LITI), and a method of manufacturing an organic light emitting device.

According to an aspect of the present invention, there is provided a frame assembly to stretch a donor film, comprising: a main body including a center opening; a first support portion including a film mounting guide portion on which the donor film is mountable; a second support portion including a film pressing portion that presses the donor film in a direction perpendicular to a coupling direction of the main body and the first support portion; and an elastic member disposed between the first support portion and the frame main body, wherein the first support portion is coupled to an inner portion of the main body by using a first coupling member, and wherein the second support portion is coupled to an inner portion of the first support portion in a direction perpendicular to the coupling direction of the main body and the first support portion by a second coupling member.

According to an aspect of the present invention, the main body may include four sides surrounding the center opening.

According to an aspect of the present invention, the first support portion may include four first support members that are separated from each other and that respectively correspond to the four sides of the main body.

According to an aspect of the present invention, the second support portion may include four second support members respectively corresponding to the four support members of the first support portion.

According to an aspect of the present invention, the elastic member may be a spring.

According to an aspect of the present invention, an elastic member mounting portion may be formed in the main body or the first support portion to receive the elastic member.

According to an aspect of the present invention, the first coupling member may be a screw passing through a first through hole formed in the main body, wherein the first coupling member is coupled to a first groove portion formed in an external surface of the first support portion.

According to an aspect of the present invention, at least the first through hole or the first groove portion may include a screw thread.

According to an aspect of the present invention, the first coupling member may pass through an inner portion of the elastic member.

According to an aspect of the present invention, the second coupling member may be a screw that passes through a second through hole formed in the second support portion, wherein the second coupling member is coupled to a second groove portion formed in the donor film mounting guide portion of the first support portion.

According to an aspect of the present invention, at least the first through groove or the first groove portion may include a screw thread corresponding to the screw.

According to another aspect of the present invention, there is provided a method of manufacturing a donor film used in laser induced thermal imaging (LITI), the method comprising: coupling a first support portion to an inner portion of a main body using a first coupling member, the first support portion including a film mounting guide portion and the main body including a center opening; mounting a donor film on the film mounting guide portion; pressing the donor film in a direction perpendicular to a coupling direction of the main body and the first support portion by using a second support portion, and fixing the second support portion to the first support portion by using a second coupling member; and adjusting a relative position of the main body and the first support portion using the first coupling member such that the donor film is stretched toward the main body while an elastic member is pressed between the main body and the first support portion, wherein the second support portion includes a film pressing portion that presses a donor film in a direction perpendicular to a coupling direction of the main body and the first support portion.

According to an aspect of the present invention, the donor film may include a light to heat conversion (LTHC) layer.

According to an aspect of the present invention, the method may further comprise forming a transfer layer on the donor film after the adjusting the relative position of the main body and the first support portion.

According to an aspect of the present invention, the transfer layer may be a single layer selected from the group consisting of an emissive organic layer, a hole injection organic layer, a hole transport organic layer, an electron transport organic layer, and an electron injection organic layer, or a multi-layer formed of at least two of these layers.

According to an aspect of the present invention, the main body may include four sides, and the donor film may be extended towards the four sides of the main body in the adjusting the relative position of the main body and the first support portion.

According to an aspect of the present invention, in the coupling of the first support portion to the inner portion of the main body, the first support portion includes four support members, and each support member may be fixed on the main body by a corresponding coupling element disposed at each of the support members.

According to an aspect of the present invention, in the pressing the donor film, four separate support members of a second support portion, respectively corresponding to the four support members of the first support portion, may be fixed to the four support members of the first support portion by using a second coupling member.

According to an aspect of the present invention, in the coupling of the first support portion to the inner portion of the main body, the first coupling member is a screw which passes through a first through hole formed in the frame main body and is coupled to a first groove portion formed in an external surface of the first support portion.

According to an aspect of the present invention, in the coupling of the main body and the first support portion, the first coupling member may pass through an inner portion of the elastic member, and the elastic member is a spring.

According to an aspect of the present invention, at least the first through hole or the first groove portion may include a screw thread corresponding to the screw.

According to an aspect of the present invention, in the pressing of the donor film, the second coupling member, which is a screw which passes through a second through hole formed in the second support portion and is coupled to a second groove portion formed in the film mounting guide portion of the first support portion.

According to an aspect of the present invention, at least the second through hole or the second groove portion may include a screw thread corresponding to the screw.

According to another aspect of the present invention, there is provided a method of manufacturing an organic light emitting device, the method comprising: assembling a frame assembly including a donor film on which a transfer layer is formed, the assembling including: coupling a first support portion to an inner portion of a main body by using a first coupling member, the first support portion including a film mounting guide portion and the main body including a center opening, mounting a donor film to the film mounting guide portion, pressing the donor film in a direction perpendicular to a coupling direction of the main body and the first support portion by using a second support portion including a film pressing portion pressing the donor film in a direction perpendicular to the coupling direction of the main body and the first support portion, fixing the second support portion to the first support portion by using a second coupling member, adjusting a relative position of the main body and the first support portion using the first coupling member so that the donor film is stretched toward the main body while an elastic member is pressed between the frame main body and the first support portion, and forming a transfer layer on the donor film; preparing an acceptor substrate comprising a pixel electrode; aligning the transfer layer of the donor film to face the pixel electrode of the acceptor substrate; and (d) irradiating laser to a predetermined area of the donor film so as to transfer an organic layer pattern on the pixel electrode.

According to an aspect of the present invention, the organic layer pattern may be a single layer selected from the group consisting of an emissive organic layer, a hole injection organic layer, a hole transport organic layer, an electron transport organic layer, and an electron injection organic layer, or a multi-layer formed of at least two of these layers.

According to the aspects of the present invention, since a transfer layer formed on the donor film is tightly extended during an LITI transfer process, the transfer efficiency can be increased by preventing minute air gaps from forming between the donor film and the acceptor substrate during the LITI transfer process. Also, the transfer efficiency can be increased since no vacuum chuck or roller lamination method is used.

Also, according to aspects of the present invention, since a process of forming a transfer layer of a donor film and a process of laminating an acceptor film of the donor film using LITI transfer do not have to be separately performed, generation of pollutants from the donor film during the transition between these processes can be prevented.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
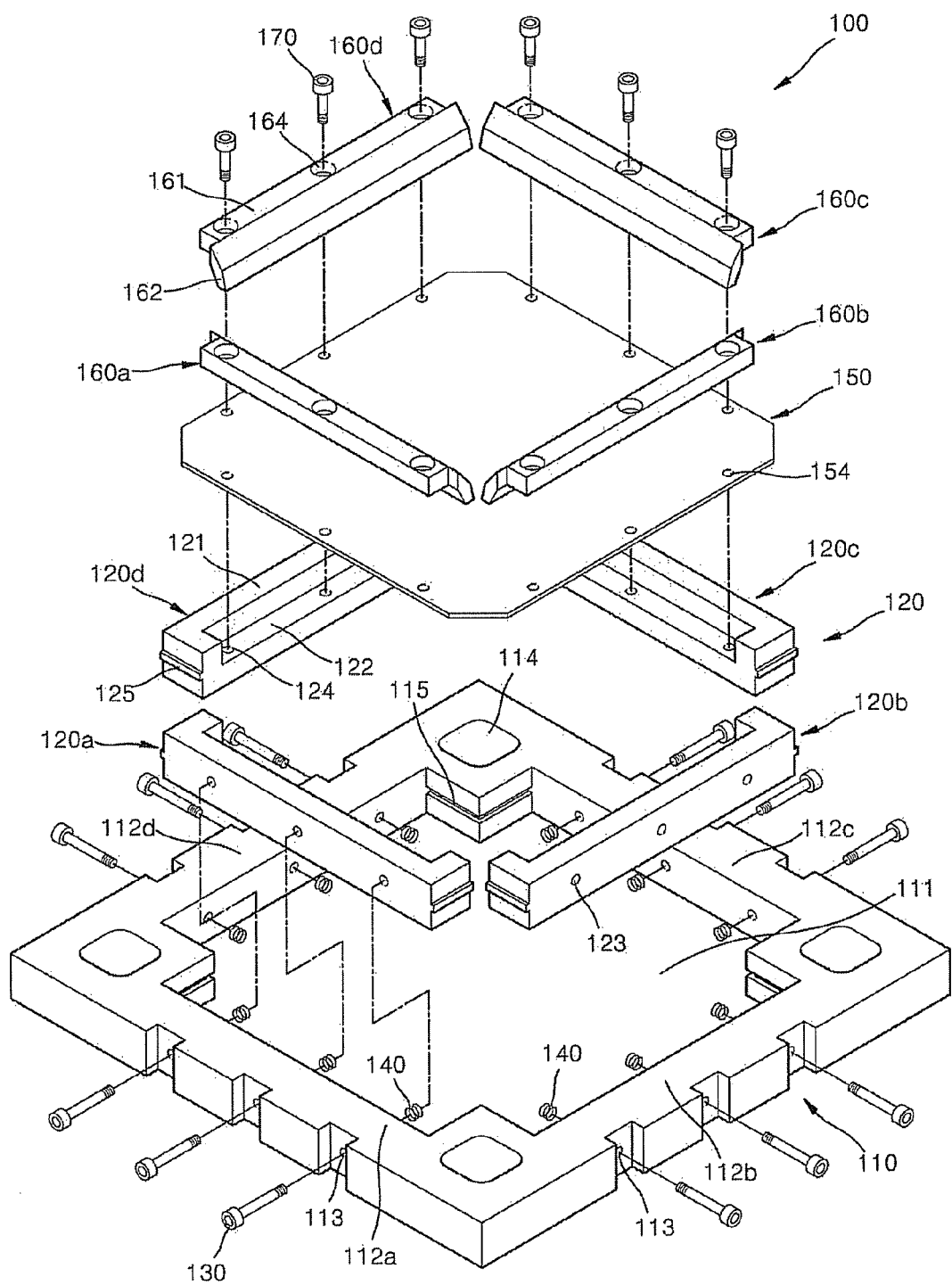
FIG. 1 is a partial perspective view illustrating a frame assembly extending a donor film according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, it is to be understood that where is stated that one film, layer or element is "formed on" a second film, layer or element, the first film, layer or element may be formed or disposed directly on the second film, layer or element or there may be intervening films, layers or elements between the first film, layer or element and the second film, layer or element. Further, as used herein, the term "formed on" is used with the same meaning as "located on" or "disposed on"

Figure 2:
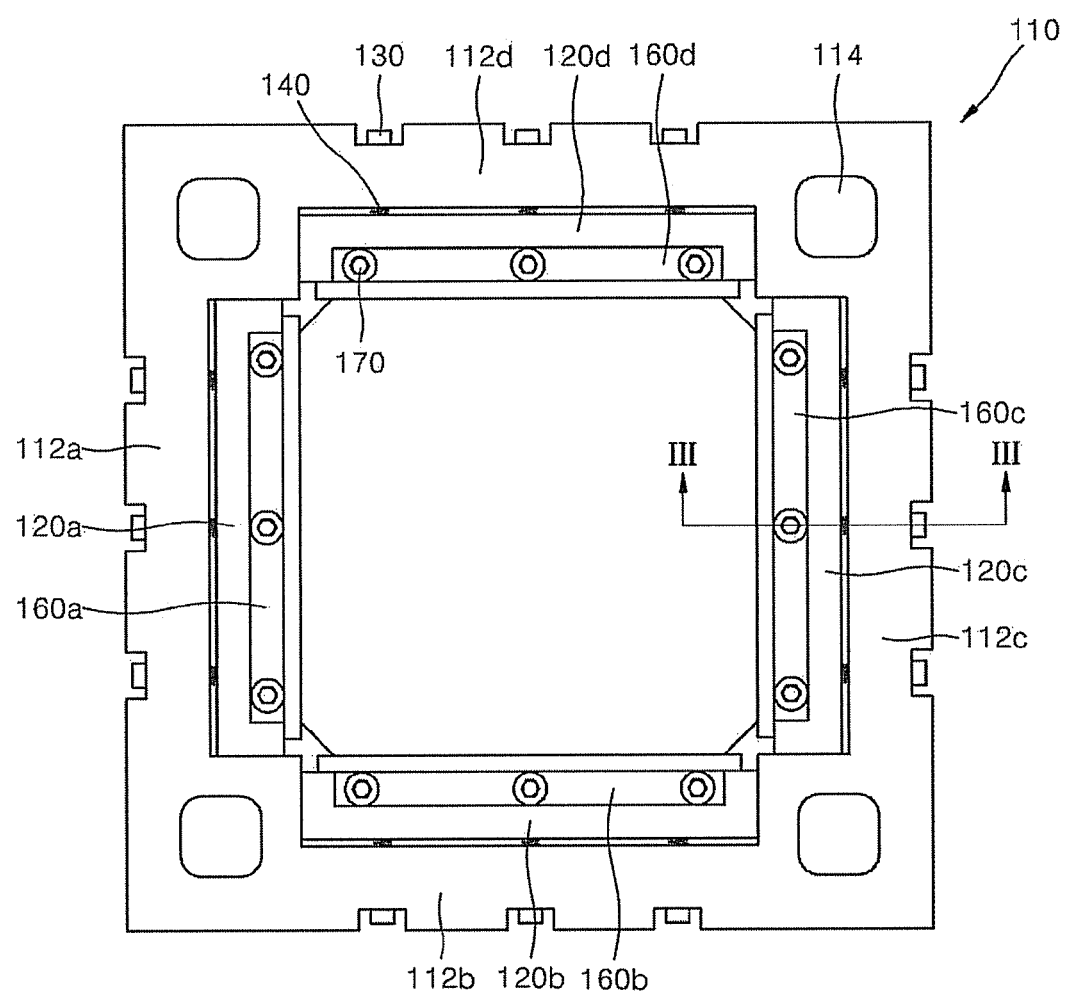
FIG. 2 is a plan view of the frame assembly of FIG. 1.
Figure 3:
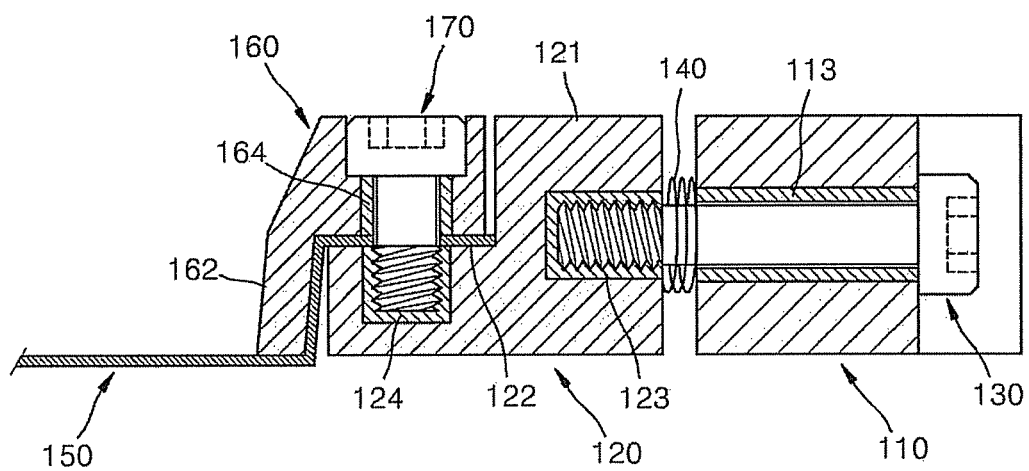
FIG. 3 is a cross-sectional view of the frame assembly cut along a line III-III of FIG. 2.

FIG. 1 is a partial perspective view illustrating a frame assembly 100 extending or stretching a donor film according to an embodiment of the present invention, FIG. 2 is a plan view of the frame assembly 100 of FIG. 1, and FIG. 3 is a cross-sectional view of the frame assembly 100 cut along a line III-III of FIG. 2.

Referring to FIGS. 1 through 3, the frame assembly 100 includes a main body 110, a first support portion 120, a second support portion 160, and an elastic member 140. The main body 110 has a center opening 111 in the center. The size of the center opening 111 is larger than a size of a front surface of an acceptor substrate (not shown), which will be described later with reference to laser induced thermal imaging (LITI).

The main body 110 has a square shape and four sides 112a, 112b, 112c, and 112d surrounding the center opening 111. First through holes 113 are formed in each of the four sides 112a, 112b, 112c, and 112d of the main body 110. A first coupling member 130, which will be described later, is disposed through the first through holes 113. In FIGS. 1 and 2, three first through holes 113 are formed in each of the sides 112a, 112b, 112c, and 112d, however, aspects of the present invention are not limited thereto. That is, as long as the first through holes 113 are arranged symmetrically on each of the sides 112a-112d, the number or position of the first through holes 113 may vary.

A small opening portion 114 is formed in each edge of the main body 110. The small opening portion 114 may distribute stress applied to the main body 110 when the first support portion 120 and the main body 110 are coupled to each other. Also, a guide groove portion 115 is formed in each inner corner of the main body 110 so as to guide coupling of the first support portion 120 to the main body 110.

Although the shown main body 110 is formed in one body, aspects of the present invention are not limited thereto. Thus, for example, the main body 110 may be formed of four separable sides that are coupled to one another.

The first support portion 120 is coupled to an inner part of the main body 110 via the first coupling member 130. Referring to FIGS. 1 and 2, the first support portion 120 includes four separate support members 120a, 120b, 120c, and 120d that are respectively coupled to the four sides 112a, 112b, 112c, and 112d of the main body 110, however, aspects of the present invention are not limited thereto. That is, the first support portion 120 may be formed in one body having a square shape. However, when the support portion 120 includes the support members 120a, 120b, 120c, and 120d, an effect of a coupling force between the main body 110 and each of the support members 120a, 120b, 120c, and 120d is reduced.

A guide protrusion portion 125 is formed on two opposing sides of the first support portion 120. The first support portion 120 is guided on the main body 110 by the above-described guide groove portion 115 and coupled to the main body 110 via the first coupling member 130.

Referring to FIG. 1, the first coupling member 130 is a screw, however, aspects of the present invention are not limited thereto and other methods of coupling may be used. The first coupling member 130 passes through the first through hole 113 in the main body 110 and is coupled to a first groove portion 123 that is formed at an outer side portion of the first support portion 120 and corresponds to a position of the first through hole 113. At least one of the first through hole 113 and the first groove portion 123 includes a screw thread corresponding to the first coupling member 130, and thus the main body 110 and the first support portion 120 is screw-coupled by tightening the first coupling member 130. However, aspects of the present invention are not limited thereto, and other methods and devices may be used for coupling.

The elastic member 140 is placed between the main body 110 and the first support portion 120. If the main body 110 and the first support portion 120 are fixed to each other for the first time, then the main body 110 and the first support portion 120 are coupled to each other while slightly pressing the elastic member 140. While shown as a spring, it is understood that the elastic member 140 can be any biasing mechanism, such as an elastic material.

The first support portion 120 includes a film mounting guide portion 122 guiding a donor film 150. The film mounting guide portion 122 is disposed lower than an upper surface 121 of the first support portion 120 and has a predetermined width. By arranging the donor film 150 along the position of the film mounting guide portion 122, the user may guide the donor film 150 to be mounted to the frame assembly 100. The first support portion 120 is coupled to the second support portion 160 via a second coupling member 170.

In FIGS. 1 and 2, four separable support members 160a, 160b, 160c, and 160d are respectively coupled to upper surfaces 121 of the four support members 120a, 120b, 120c, and 120d of the first support portion 120, however, aspects of the present invention are not limited thereto. That is, the second support portion 160 may be formed in one body having a square shape. However, when the second support portion 160 includes the support members 160a, 160b, 160c, and 160d as a single body, an effect of a coupling force between the first support portion 120 and each of the support members 160a, 160b, 160c, and 160d is reduced.

The second coupling member 170 is shown as a screw, however, aspects of the present invention are not limited thereto. The second coupling member 170 passes through a second through hole 164 formed in the second support portion 160 and is coupled to a second groove portion 124 that is formed in the film mounting guide portion 122 and corresponds to a position of the second through hole 164. At least one of the second through hole 164 and the second groove portion 124 includes a screw thread corresponding to the second coupling member 170, and thus the first support portion 120 and the second support portion 160 may be coupled by tightening the second coupling member 170.

The first support portion 120 and the second support portion 160 are coupled and the donor film 150 is mounted in the film mounting guide portion 122. A plurality of guide holes 154 corresponding to positions of the second through hole 164 and the second groove portion 124 may be formed in each edge of the donor film 150. However, aspects of the present invention are not limited thereto, and the guide holes 154 may not be formed in the donor film 150.

The second support portion 160 includes a film pressing unit 162 protruding in a downward vertical direction towards the film mounting guide portion 122. After aligning the second support portion 160 and the first support portion 120, the second support portion 160 is pulled downward, and then the film pressing portion 162 presses the donor film 150, which is supported by the film mounting guide portion 122, downward to the extended donor film 150. Thus, by tightening the second coupling member 170, the first support portion 120 and the second support portion 160 are coupled completely.

Referring to FIG. 3, if the first support portion 120 and the second support portion 160 are coupled, then a lower end portion of the film pressing portion 162 is lower than lower end portions of the frame main body 110 and the first support portion 120. Accordingly, since the donor film 150 is positioned lower than the lower end portions of the frame main body 110 and the first support portion 120, restrictions due to the size or position of the acceptor substrate in regards to an LITI transfer process are reduced. The elastic member 140 is included between the frame main body 110 and the first support portion 120.

Figure 4A:
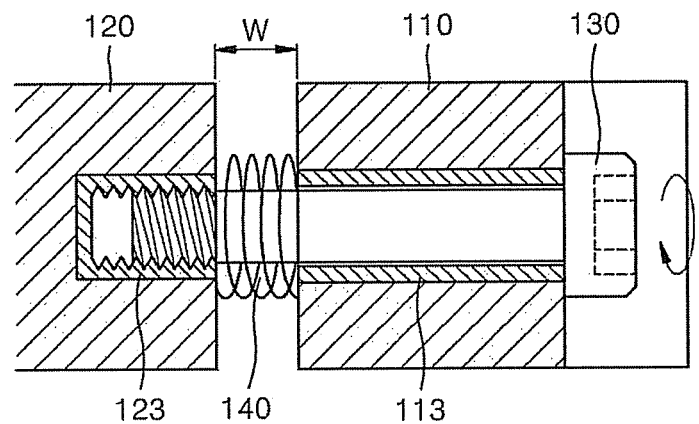
FIGS. 4A and 4B are cross-sectional views illustrating a main body coupled to a first support portion by using a first coupling member according to an embodiment of the present invention.

Referring to FIG. 4A, when the frame main body 110 and the first support portion 120 are coupled for the first time, the elastic member 140 is hardly pressed, and an inner wall of the frame main body 110 and an outer wall of the first support portion 120 are separated apart at a predetermined width W.

Figure 4B:
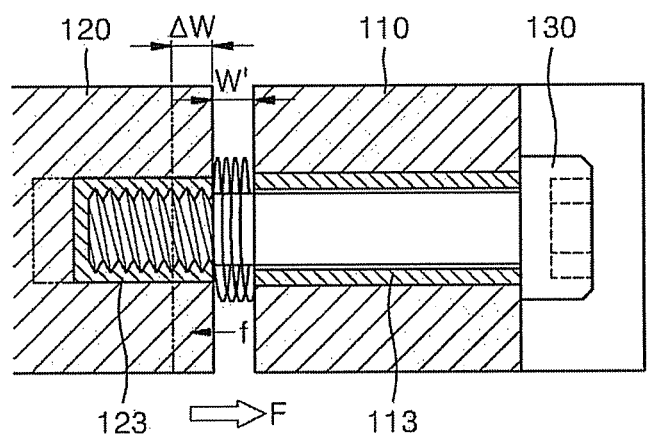

Referring to FIG. 4B, when the first coupling member 130 is tightened further, since the frame main body 110 is attached to the first support portion 120 because of the first coupling member 130, the first support portion 120 moves toward the frame main body 110 due to a force F generated by first coupling member 130. Consequently, a distance between the inner wall of the main body 110 and the outer wall of the first support portion 120 is reduced to a width W'. The force F applied to the first support portion 120 also applies to the second support portion 160 and the donor film 150 that are coupled to the first support portion 120. Accordingly, the donor film 150 is extended or stretched to the outside of the main body 110 by a width difference ΔW between the main body 110 and the first support portion 120.

Meanwhile, the first support portion 120 presses the elastic member 140, and a force f generated by the elastic member 140 opposes the force F applied to the first support portion 120. Consequently, the force f generated by the elastic member 140 reduces an extension speed of the donor film 150, thereby enabling precise adjustment of extension of the donor film 150. Accordingly, a user may adjust the amount of coupling of the first coupling member 130 that couples the frame main body 110 and the first support portion 120, thereby adjusting the amount of pressing the elastic member 140 and the amount of extension of the donor film 150. Since the force F may be applied to all of the four sides 112a, 112b, 112c, 112d of the main body 110, the donor film 150 may be extended or stretched toward the main body 110 according to need.

Figure 5A:
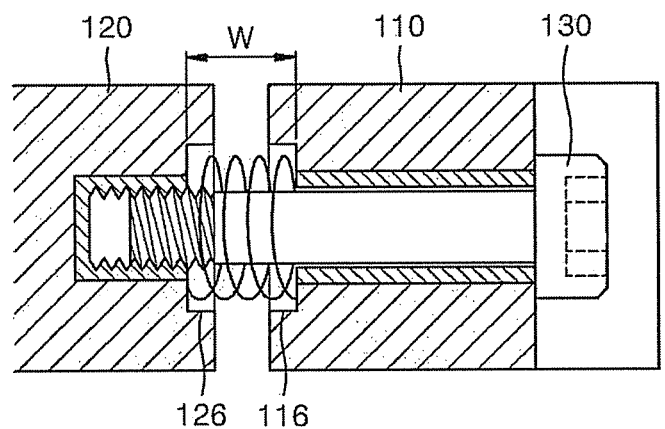
FIGS. 5A and 5B are cross-sectional views illustrating a main body coupled to a first support portion by using a first coupling member according to another embodiment of the present invention.
Figure 5B:
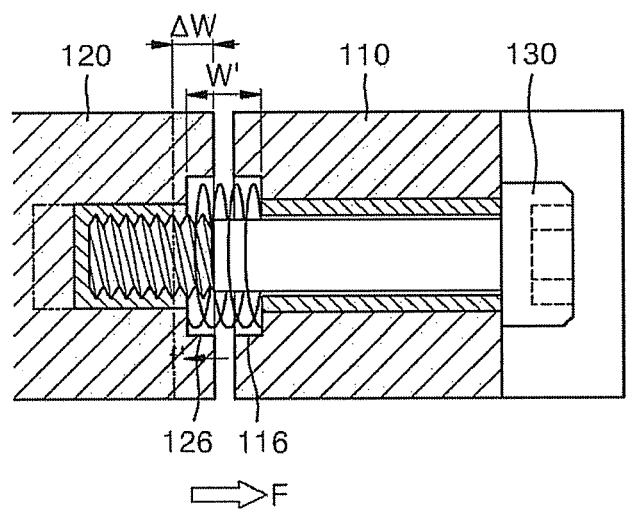

FIGS. 5A and 5B illustrate a portion of the frame assembly 100 of FIG. 1 according to another embodiment of the present invention. The shown embodiment is the same as the embodiment illustrated in FIGS. 4A and 4B, however, FIGS. 5A and 5B illustrate elastic member mounting portions 116 and 126 where the elastic member 140 is mounted. The elastic member mounting portions 116 and 126 are respectively formed in a main body 110 and a first support portion 120. According to another aspect of the present invention, only one of the elastic member mounting portion 116 or the elastic member mounting portion 126 is formed in the main body 110 or the first support portion 120, respectively.

According to the frame assembly 100 extending a donor film according to the above embodiment of the present invention, the donor film 500 may be tightly extended, and an amount of extension thereof may be minutely adjusted. Accordingly, generation of minute air between the donor film 500 and an acceptor substrate during an LITI transfer process can be prevented, thereby increasing the transfer efficiency.

Figure 6:
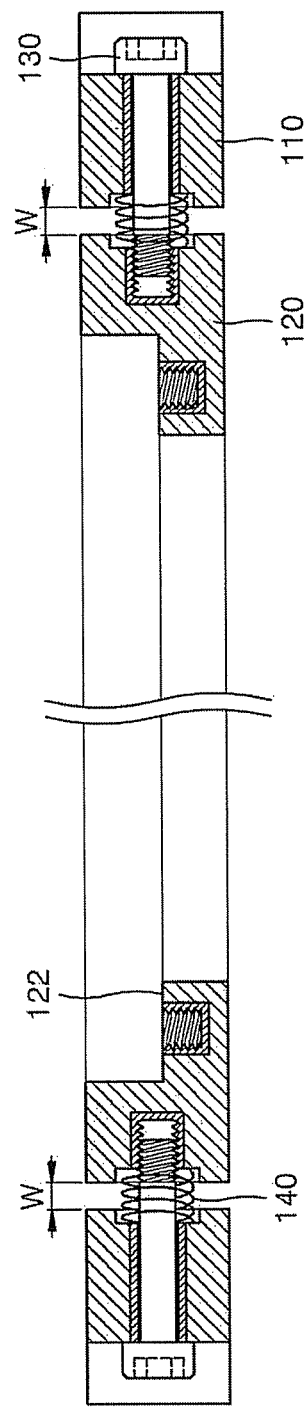
FIGS. 6 through 9 are cross-sectional views illustrating a method of forming a donor film according to an embodiment of the present invention.

Hereinafter, a method of manufacturing a donor film by using the above-described frame assembly 100 according to an embodiment of the present invention will be described with reference to FIGS. 6 through 9. Referring to FIG. 6, a first support portion 120 including a film mounting guide portion 122 is coupled to an inner portion of the main body 110 including an center opening 111, by using a first coupling member 130. A predetermined width W is maintained between the main body 110 and the film mounting guide portion 122 so that an elastic member 140 is not pressed.

Figure 7:
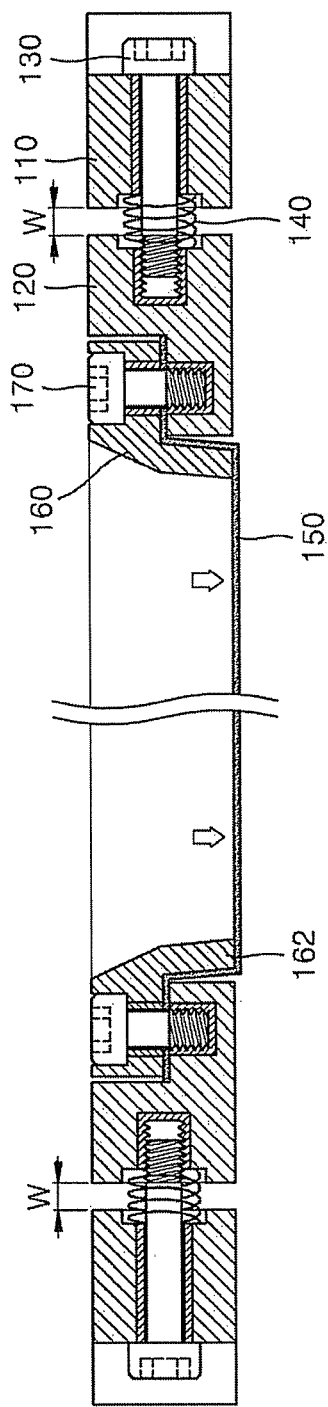

Next, referring to FIG. 7, a donor film 150 is mounted on the film mounting guide portion 122. The donor film 150 at this stage is a film formed of a base film including a light to heat conversion (LTHC) layer (not shown). Next, the donor film 150 is pressed by using the second support portion 160 including a film pressing portion 162 in a direction perpendicular to a coupling direction of the main body 110 and the first support portion 120 so as to fix the second support portion 160 to the first support portion 120 through the second coupling member 170.

Figure 8:
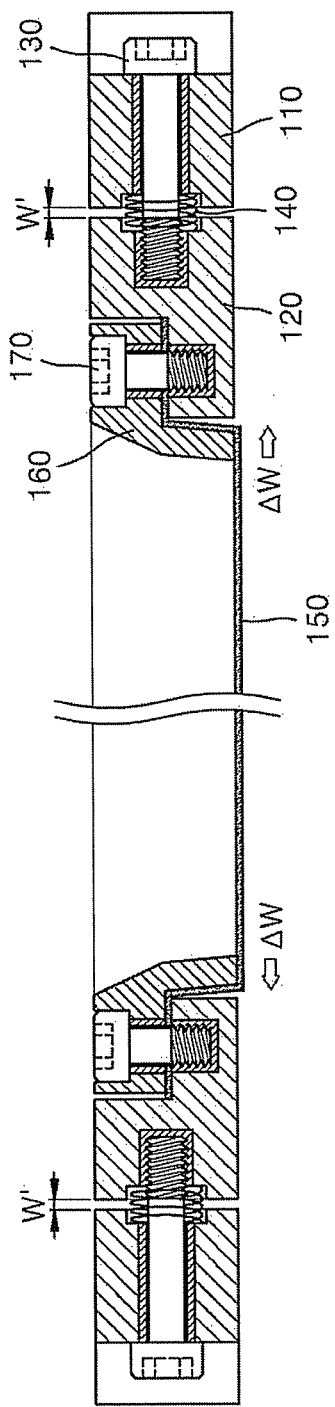

Next, referring to FIG. 8, by adjusting an amount of coupling of the first coupling member 130, the elastic member 140 disposed between the main body 110 and the first support portion 120 is pressed, thereby coupling the main body 110 and the first support portion 120 such that a distance between the frame main body 110 and the first support portion 120 is a distance W'. The first support portion 120 moves toward the main body 110, and the donor film 150 coupled to the first support portion 120 is extended by ΔW in opposite directions. The elastic member 140 may offset forces of the first support portion 120 toward the outside, and thus a amount of extension of the donor film 150 may be adjusted substantially by adjusting the amount of coupling of the first coupling member 130.

Figure 9:
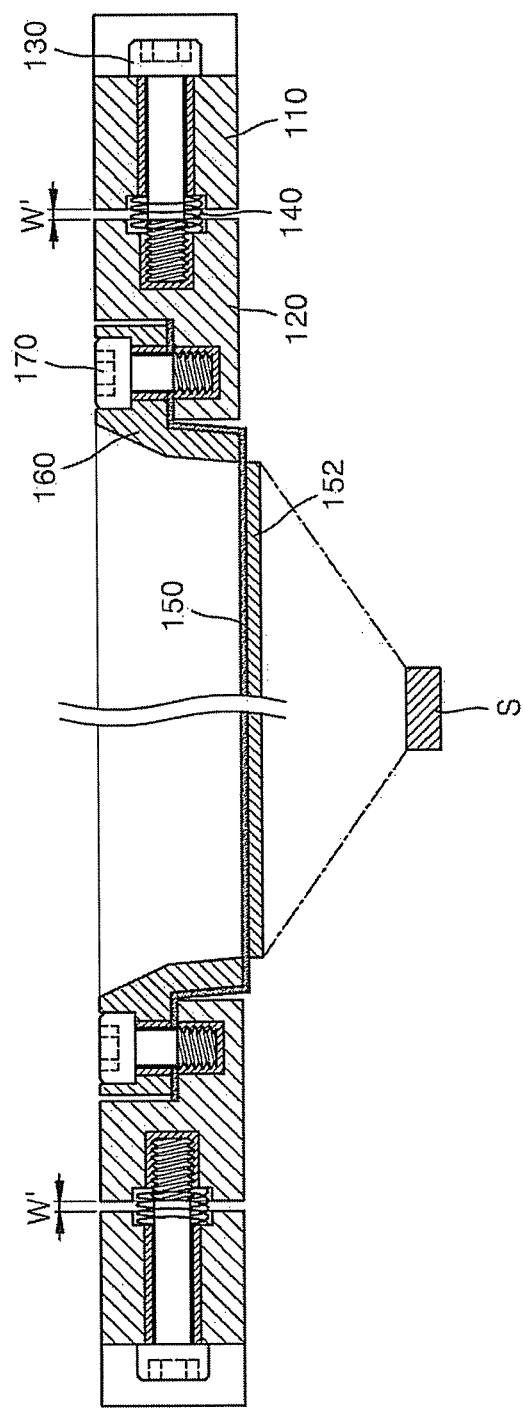

Next, referring to FIG. 9, a transfer layer 152 is formed on the donor film 150 by using an evaporation method as a deposition source S moves relative to the frame assembly 100 within a deposition chamber (not shown). The transfer layer 152 may be a single layer selected from the group consisting of an emissive organic layer, a hole injection organic layer, a hole transport organic layer, an electron transport organic layer, and an electron injection organic layer, or a multi-layer formed of at least two of these layers. Upon the transfer layer 152 being formed, the donor film 150 is completely formed.

As described above, as the transfer layer 152 is formed on the donor film 150 while the donor film 150 is tightly extended, the transfer efficiency of an LITI transfer process can be increased.

Figure 10:
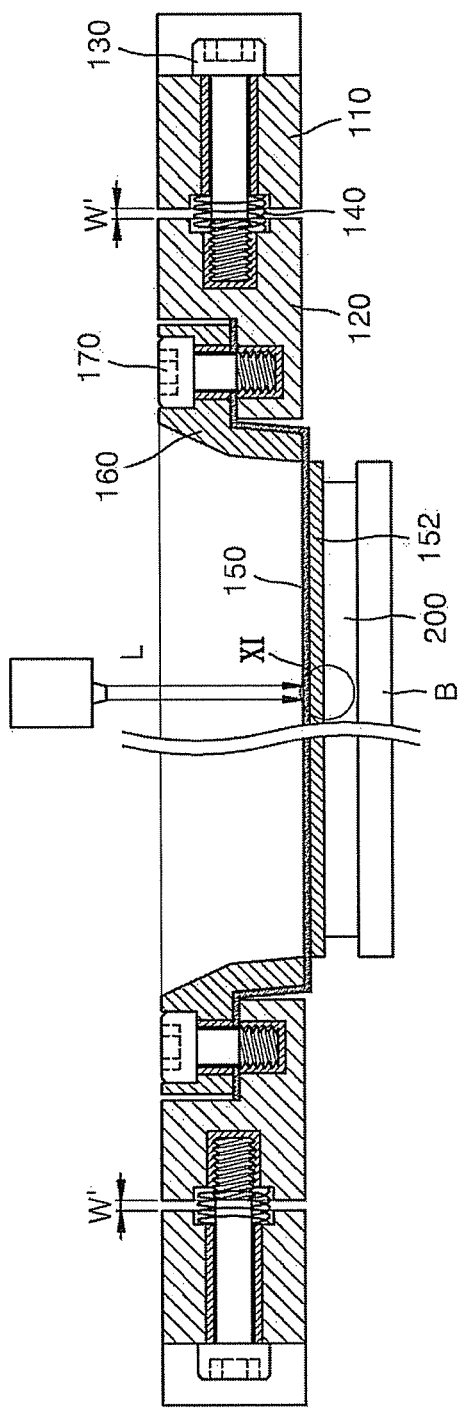
FIG. 10 is a cross-sectional view illustrating a laser induced thermal imaging (LITI) transfer process.

Hereinafter, a method of manufacturing an organic light emitting device by using the above-described donor film 150 and frame assembly 100 extending the donor film will be described with reference to FIGS. 10 and 11. FIG. 10 illustrates irradiation of a laser L in an LITI transfer process while the donor film 150 having the transfer layer 152 and an acceptor substrate 200 are aligned, and FIG. 11 shown an extended cross-sectional view illustrating a portion XI of FIG. 10.

Figure 11:
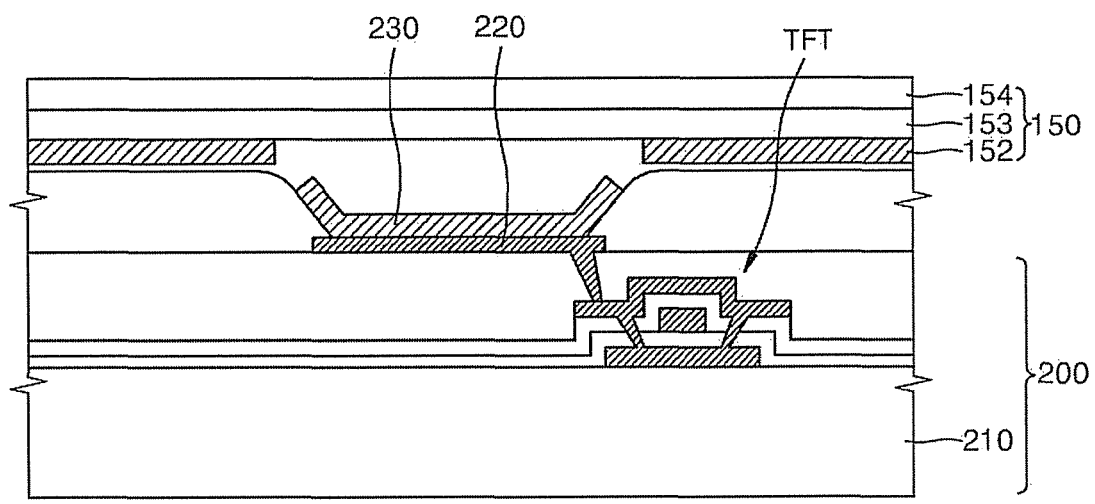
FIG. 11 is an extended cross-sectional view illustrating a portion XI of FIG. 10.

Referring to FIGS. 10 and 11, the acceptor substrate 200 includes a thin film transistor (TFT) formed on a substrate 210 and a pixel electrode 220 connected to the TFT. Furthermore, the transfer layer 152 of the donor film 150 coupled to the frame assembly 100, as described with reference to the previous embodiment, and the pixel electrode 220 are aligned so as to face each other.

The laser L is irradiated onto a portion of the donor film 150. The irradiated laser L is absorbed by a LTHC layer 153 of the donor film 150 and generates heat at a specific location. The generated heat reduces an adhesive force between the transfer layer 152 and the LTHC layer 153, and thus the transfer layer 152 is transferred onto the acceptor substrate 200 at this location. As a result, a transfer layer pattern 230 is formed on the pixel electrode 220 of the acceptor substrate 200.

The above transfer process is performed in an $N_2$ atmosphere because a normal atmosphere contains water and oxygen and the transferred organic layer pattern 230 may be deteriorated. Also, due to the above reason, the transfer process may be performed in a vacuum atmosphere. However, aspects of the present invention are not limited thereto, and atmospheres that to do not deteriorate the transferred organic layer pattern 230 may be used.

Meanwhile, the transferred organic layer pattern 230 in FIG. 11 is an organic light emitting layer, however, aspects of the present invention are not limited thereto. That is, the transferred organic layer pattern 230 may be a single layer selected from the group consisting of an emissive organic layer, a hole injection organic layer, a hole transport organic layer, an electron transport organic layer, and an electron injection organic layer, or a multi-layer formed of at least two of these layers.

Also, the donor film 150 in FIG. 11 has layered thereon a base film 154, the LTHC layer 153, and the transfer layer 152, however, aspects of the present invention are not limited thereto. A plurality of layers having various functions such as a buffer layer, etc., may also be further included.

According to the above-described aspects of the present invention, since a transfer layer formed on the tightly extended donor film is used in the LITI transfer process, generation of minute air gaps between the donor film and the acceptor substrate during a transfer process can be prevented, thereby increasing the transfer efficiency. Also, since a vacuum chuck used in the conventional art to fix a donor film and a roller lamination method to remove minute air gaps in the conventional art are not necessary, the process efficiency can be increased as unnecessary equipment or processes can be omitted.

Also, the process of forming a transfer layer on the donor film and the lamination process with regards to the acceptor substrate of the donor film of the LITI transfer process do not have to be separated, and thus generation of pollutants generated from the donor film during transition between these processes may be prevented.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A frame assembly to stretch a donor film, comprising:
   a main body having a center opening;
   a first support portion including a film mounting guide portion on which the donor film is mounted, the first support portion being disposed in the center opening of the main body; and
   a second support portion including a film pressing portion to press the mounted donor film against the first support portion, the second support portion being disposed on the first support portion such that the mounted donor film is disposed between the second support portion and the first support portion,
   wherein the first support portion is movable in lateral directions inside the center opening in order to adjust a relative position of the main body and the first support portion to stretch the donor film while being pressed by the film pressing portion.

2. The frame assembly of claim 1, further comprising:
   an elastic member disposed between the first support portion and the main body;
   a first coupling member coupling the first support portion to an inner portion of the main body; and
   a second coupling member coupling the second support portion to an upper portion of the main body.

3. The frame assembly of claim 2, wherein the film pressing portion presses the donor film in a direction perpendicular to the lateral directions inside the center opening.

4. The frame assembly to stretch a donor film of claim 3, wherein the main body includes four sides surrounding the center opening in which the first support portion is disposed.

5. The frame assembly to stretch a donor film of claim 4, wherein the first support portion includes four separable first support members that respectively correspond to the four sides of the main body.

6. The frame assembly to stretch a donor film of claim 5, wherein the second support portion includes four separable second support members respectively corresponding to the four support members of the first support portion.

7. The frame assembly to stretch a donor film of claim 3, wherein the elastic member is a spring.

8. The frame assembly to stretch a donor film of claim 3, wherein an elastic member mounting portion is formed in the main body or the first support portion which receives the elastic member.

9. The frame assembly to stretch a donor film of claim 3, wherein the first coupling member is a screw, passing through a first through hole formed in the main body, wherein the first coupling member is coupled to a first groove portion formed in an external surface of the first support portion.

10. The frame assembly to stretch a donor film of claim 9, wherein at least the first through hole or the first groove portion includes a screw thread.

11. The frame assembly to stretch a donor film of claim 3, wherein the first coupling member passes through an inner portion of the elastic member.

12. The frame assembly to stretch a donor film of claim 3, wherein the second coupling member is a screw that passes through a second through hole formed in the second support portion, wherein the second coupling member is coupled to a second groove portion formed in the donor film mounting guide portion of the first support portion.

13. The frame assembly to stretch a donor film of claim 12, wherein at least the first through groove or the first groove portion includes a screw thread corresponding to the screw.

14. A method of forming a donor film having a transfer layer used in laser induced thermal imaging (LITI), the method comprising:
mounting a donor film in a film mounting guide portion of a frame assembly having a main body having a center opening, a first support portion including the film mounting guide portion, and a second support portion including a film pressing portion;
pressing the donor film in an open direction of the center opening by coupling the second support portion including the film pressing portion to the first support portion;
stretching a donor film by respectively moving four sides of the first support portion towards four sides of the main body corresponding to the four sides of the first support portion; and
forming a transfer layer on the stretched donor film.

15. The method of claim 14, wherein the frame assembly includes an elastic member disposed between the first support portion and the main body, a first coupling member coupling the first support portion to an inner portion of the main body, and a second coupling member coupling the second support portion to an upper portion of the main body.

16. The method of claim 15, wherein the film pressing portion presses the donor film in a direction perpendicular to lateral directions inside the center opening.

17. The method of claim 16, wherein the donor film includes a light to heat conversion (LTHC) layer.

18. The method of claim 17, further comprising forming a transfer layer on the donor film after adjusting a relative position of the main body and the first support portion.

19. The method of claim 18, wherein the transfer layer comprises at least one selected from the group consisting of an emissive organic layer, a hole injection organic layer, a hole transport organic layer, an electron transport organic layer, and an electron injection organic layer.

20. The method of claim 16, wherein the main body includes four sides, and the donor film is extended towards the four sides of the main body when adjusting a relative position of the main body and the first support portion.

21. The method of claim 16, wherein in the coupling of the first support portion to the inner portion of the main body, the first support portion includes four support members and the coupling member includes coupling elements, and each support member is fixed on the main body by using a corresponding one of the coupling elements.

22. The method of claim 21, wherein in the pressing of the donor film, four separate support members of the second support portion, respectively corresponding to the four support members of the first support portion, are fixed to the four support members of the first support portion by using a second coupling member.

23. The method of claim 16, wherein in the coupling of the first support portion to the inner portion of the main body, the first coupling member is a screw which passes through a first through hole formed in the main body and is coupled to a first groove portion formed in an external surface of the first support portion.

24. The method of claim 23, wherein, when adjusting the main body and the first support portion, the first coupling member passes through an inner portion of the elastic member, and the elastic member is a spring.

25. The method of claim 23, wherein at least the first through hole or the first groove portion includes a screw thread corresponding to the screw.

26. The method of claim 16, wherein in the pressing of the donor film, the second coupling member is a screw which passes through a second through hole formed in the second support portion and is coupled to a second groove portion formed in the film mounting guide portion of the first support portion.

27. The method of claim 26, wherein at least the second through hole or the second groove portion includes a screw thread corresponding to the screw.

28. A method of manufacturing an organic light emitting device, the method comprising:
assembling a frame assembly including a donor film on which a transfer layer is formed, the assembling comprising:
mounting the donor film in a film mounting guide portion of the frame assembly having a main body having a center opening, a first support portion including the film mounting guide portion, and a second support portion including a film pressing portion;
pressing the donor film in an open direction of the center opening by coupling the second support portion including the film pressing portion to the first support portion;
stretching the donor film by respectively moving four sides of the first support portion towards four sides of the main body corresponding to the four sides of the first support portion; and
forming the transfer layer on the stretched donor film;
preparing an acceptor substrate comprising a pixel electrode;
aligning the transfer layer of the donor film to face the pixel electrode of the acceptor substrate; and
irradiating laser to a predetermined area of the donor film so as to transfer an organic layer pattern on the pixel electrode.

29. The method of claim 28, wherein the frame assembly includes an elastic member disposed between the first support portion and the main body, a first coupling member coupling the first support portion to an inner portion of the main body, and a second coupling member coupling the second support portion to an upper portion of the main body.

30. The method of claim 28, wherein the organic layer pattern comprises at least one selected from the group consisting of an emissive organic layer, a hole injection organic layer, a hole transport organic layer, an electron transport organic layer, and an electron injection organic layer.

* * * * *